United States Patent [19]
Kim

[11] Patent Number: 6,115,587
[45] Date of Patent: Sep. 5, 2000

[54] RADIO SIGNAL POWER CONTROL METHOD ACCORDING TO VARIATION OF FREQUENCY AND TEMPERATURE IN PAGING TRANSMITTER

[75] Inventor: Young-ki Kim, Seoul, Rep. of Korea

[73] Assignee: Samsung Electronics Co., Ltd., Rep. of Korea

[21] Appl. No.: 08/987,514

[22] Filed: Dec. 9, 1997

[30] Foreign Application Priority Data

Jan. 31, 1997 [KR]  Rep. of Korea .................. 97-3069

[51] Int. Cl.⁷ ..................................................... H04B 1/40
[52] U.S. Cl. ........................... 455/126; 455/115; 330/129
[58] Field of Search ............................. 455/69, 522, 127, 455/91, 115, 116, 126; 330/129, 2

[56] References Cited

U.S. PATENT DOCUMENTS

| | | | |
|---|---|---|---|
| 5,081,713 | 1/1992 | Miyazaki | 455/115 |
| 5,774,797 | 7/1998 | Kawano et al. | 455/115 |

FOREIGN PATENT DOCUMENTS

| | | | |
|---|---|---|---|
| 2281461 | 3/1995 | United Kingdom | H03G 3/20 |

*Primary Examiner*—Thanh Cong Le
*Attorney, Agent, or Firm*—Dilworth & Barrese

[57] ABSTRACT

A method for controlling and maintaining the power of an RF signal outputted in a paging transmitter operating at a wideband frequency range (over 10 MHz) and wide temperature range (−30~+60° C.). The power value corresponding to the power detect voltage (PDV) of a radio signal transmitted from a base station and the temperature value corresponding to temperature detect voltage (TDV) upon transmitting the radio signal are mapped using a matching table. The method includes the steps of: (a) detecting a voltage representing the power of the radio signal upon transmission of the same, searching the matching table for a power value and temperature value for transmission of the radio signal and displaying the searched values to an operator; (b) analyzing the frequency and temperature of the transmitted radio signal and calculating final power value data of the radio signal after compensating the power value by using a first offset value having preset power error between real power and operation power according to the given frequency range of wide frequency band, and a second temperature offset value having which corrects any error between the real power and operation power according to the given temperature range of wide operation temperature band; and (c) comparing the calculated final power data with current operation power data and controlling the power of the transmitted radio signal.

14 Claims, 6 Drawing Sheets

RADIO SIGNAL POWER CONTROL METHOD ACCORDING TO VARIATION OF FREQUENCY AND TEMPERATURE IN PAGING TRANSMITTER

BACKGROUND OF THE INVENTION

1. Field of the Invention

The present invention relates to a method for controlling a paging transceiver. More specifically, it relates to a method for maintaining a given output power level by compensating for changes in the output power level resulting from variations of frequency and temperature.

2. Description of the Related Art

FIG. 1 is block diagram showing the construction of a general paging transmitter. The output control of the paging transmitter as depicted in FIG. 1 is generally performed as follows. A transmission signal modulated in a modulator 2 is transmitted through antenna 10 after the output is amplified in a power amplifier unit 4. A power detect unit 6 positioned between the power amplifier unit 4 and the antenna 10 detects the output(power) of the RF signal outputted in a final terminal of the paging transmitter. Power detect voltage (PDV) is generated by converting the output of power amplifier unit 4 into the direct current in the power detect unit 6. The PDV is then applied to a main control unit 8. Also, a temperature detect voltage (TDV) is generated by converting the current temperature for the output of power amplifier unit 4 into the direct current in power detect unit 6. The TDV is then applied to the main control unit 8. The power detect voltage PDV and the temperature detect voltage TDV are transmitted to an A/D converter of the main control unit 8 where the respective analog voltage signals are converted into digital data which is applied to an internal processor.

The internal processing performed by main control unit 8 is illustrated in FIG. 2. FIG. 2 is a flow chart showing conventional RF power control operations in a paging transmitter. The internal processor installed within the main control unit 8 checks at step 100 whether or not the RF signal is under outputting. Thus, when determined that the RF signal was under outputting, the processor detects the power detect voltage PDV and the temperature detect voltage TDV applied from the power detect unit 6 as the digital data. Thereafter, the processor proceeds to step 102, and searches for current power of the RF signal and the temperature thereof in a matching table contained in the memory. The current power of the RF signal and temperature thereof is determined on the basis of the power detect voltage PDV and the temperature detect voltage TDV. The searched power and temperature is displayed as output data to an operator. The processor then compares the output data (the power value of the RF signal) with the preset operation power data at step 104. When the power data is different from the preset data thereas, the processor increases/raises or lowers the power control voltage PCV by using a D/A converter. That is, when the preset operation power data is more than the current power, the processor increases the power control voltage PCV at step 106. However, when the preset operation power data is less than the current power, the processor lowers the power control voltage PCV at step 108. In accordance with this, the power at the final terminal of the transmitter can be increased or lowered in relation to the power control voltage PCV. Thus, the power voltage applied to main control unit 8 is also varied, and the processor takes the loop and repeats the above operations until the digital data of the voltage is equal to the preset operation power value.

A method for controlling the RF power at the paging transmitter according to the prior art as described above is performed through easily controlling the RF power of the single frequency at the normal temperature. However, when the paging transmitter is used at the wideband frequency range (i.e., over 100 MHz) and over a wide temperature range (−30~+60° C.), the power control value of the paging transmitter at the specific frequency and temperature differs greatly from the power meter directive value as dictated in the real power meter.

The following tables 1–3 show these differences. Table 1 shows the effect of varying frequencies on the main control unit directive value and the power meter directive value. Table 2 shows the effect of varying temperature on the main control unit directive value and the power meter directive value, and table 3 shows the effect of frequency and temperature variation on the main control unit directive value and the power meter directive. With reference to tables 1–3, the main control unit directive value and the power meter directive value change in response to the variation of frequency in the wideband frequency range (over 10 MHz) and the temperature variation at wide temperature range (−30~+60° C.).

TABLE 1

| main control unit directive value | power meter directive value | | |
|---|---|---|---|
| | 928 Mhz (normal temperature) | 936 Mhz (normal temperature) | 944 Mhz (normal temperature) |
| 300 watt | 293 | 300 | 305 |
| 290 watt | 285 | 291 | 295 |
| 280 watt | 275 | 280 | 283 |
| 270 watt | 263 | 269 | 273 |
| 260 watt | 253 | 260 | 265 |
| 250 watt | 245 | 250 | 255 |

TABLE 2

| main control unit directive value | power meter directive value | | |
|---|---|---|---|
| | high temperature [936 MHz] | normal temperature [936 MHz] | low temperature [936 MHz] |
| 300 watt | 270 | 300 | 330 |
| 290 watt | 261 | 291 | 321 |
| 280 watt | 250 | 280 | 310 |
| 270 watt | 243 | 269 | 303 |
| 260 watt | 233 | 260 | 291 |
| 250 watt | 225 | 250 | 281 |

TABLE 3

| main control unit directive value | power meter directive value | | |
|---|---|---|---|
| | 928 MHz, high temperature | 936 MHz, normal temperature | 944 MHz, low temperature |
| 300 watt | 263 | 300 | 335 |
| 290 watt | 256 | 291 | 328 |
| 280 watt | 245 | 280 | 313 |
| 270 watt | 236 | 269 | 306 |

TABLE 3-continued

| | power meter directive value | | |
|---|---|---|---|
| main control unit directive value | 928 MHz, high temperature | 936 MHz, normal temperature | 944 MHz, low temperature |
| 260 watt | 225 | 260 | 298 |
| 250 watt | 220 | 250 | 288 |

FIG. 4 is a graphical chart showing the comparison characteristics of a control unit directive value of RF power and a power meter directive value thereof as a function of frequency and temperature according to the prior art paging transmitter.

SUMMARY OF THE INVENTION

It is an object of the present invention to provide a method for controlling and maintaining the power of the RF signal output in a paging transmitter when using the paging transmitter at the wideband frequency range (i.e., over 10 MHz) and over a wide temperature range (e.g., −30~+60° C.).

It is another object of the present invention to provide a method for detecting errors in the RF signal output at the paging transmitter resulting from frequency and temperature variations, compensating for the detected error, and constantly maintaining the power of the paging transmitter.

In order to achieve these and other objects, the present invention provides a method for controlling RF power of a paging transmitter utilizing a matching table where the power value corresponding to power detect voltage of a radio signal transmitted from a base station and the temperature value corresponding to temperature detect voltage upon transmitting the radio signal are mapped. The paging transmitter is being operated within a wide temperature range and at wideband frequencies. The method comprises the steps of: (a) detecting a voltage representing the power of the radio signal upon transmission of the signal, searching the current power and temperature value from a matching table for transmission of the radio signal and displaying the searched values to an operator; (b) analyzing the frequency and temperature of the transmitted radio signal and calculating a final power value data of the radio signal, the final power value data being compensated by using a first offset value having a preset power error between the real or current power and the desired operation power according to the frequency range of wide frequency band, and a second offset value having a preset power error between the real or current power and the desired operation power according to the temperature range of the wide operation temperature band; and (c) comparing the calculated final power data with the current operation power data and controlling the power of the transmitted radio signal.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE PREFERRED EMBODIMENT(S)

Figure 1:
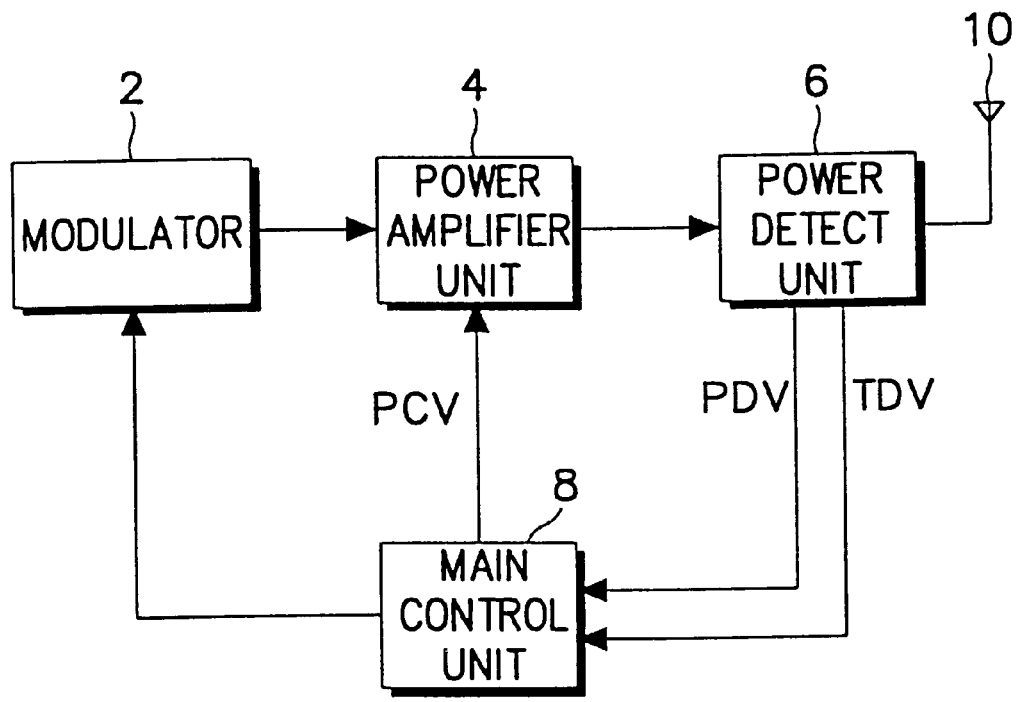
FIG. 1 is block diagram showing the construction of a general paging transmitter.

Hereinafter, a preferred embodiment of the present invention will be concretely explained with reference with accompanying drawings. Throughout the drawings, it is noted that the same reference numerals will be used to designate like or equivalent elements having the same function. Further, the detailed description on known function and constructions unnecessarily obscuring the subject matter of the present invention will be avoided in the present invention.

FIG. 1 is block diagram showing the construction of a general paging transmitter. According to an embodiment of the invention, the control of the RF power is performed on the basis of detecting the current power (signal) and compensating for any errors resulting from variations in the frequency and temperature. Referring to table 3, it can be understood that errors are generated at high frequencies and low temperatures and at low frequencies and high temperatures.

In an embodiment of the present invention, after detecting the RF power of the paging transmitter, differences between the current or real RF power value according to the current frequency and temperature conditions and the optimal or required operation power, are compensated.

As indicated in the above tables 1 and 2, the difference according to frequency and temperature is formed at a given ratio and thus, the required offset for each case can be obtained with following methods 1, 2, and 3.

METHOD 1

Since the operation power (main control unit directive value) is equal to the power meter directive value as in most identical cases, the average of the operation power can be defined as the reference value.

Thus, the reference value is (300+290+280+270+260+250)/6=275 watts.

METHOD 2

The frequency offset can be obtained by using the difference between the reference value and the average value of the power meter directive value for each frequency.

The average of the power meter directive value at 928 MHz is (293+285+275+263+253+245)/6=268 watts, thus the average error (i.e., offset) is 268−275=−7 watts.

And, the average of the power meter directive value at 944 MHz is (305+295+283+277+265+255)/6=280 watts, the average error (i.e., offset) is 280−275=+5 watts.

METHOD 3

The temperature offset can be obtained using the difference between the reference value and the average value of the power meter directive value for each temperature.

Because the average of the power meter directive value at the high temperature is (270+261+250+243+233+225)/6= 247 watts, the average error (offset) is 247−275=−28 watts. And, since the average of the power meter directive value at the low temperature is (330+321+310+303+291+281)/6= 280 watts, the average error (offset) is 306−275=+31 watts.

Figure 3A:
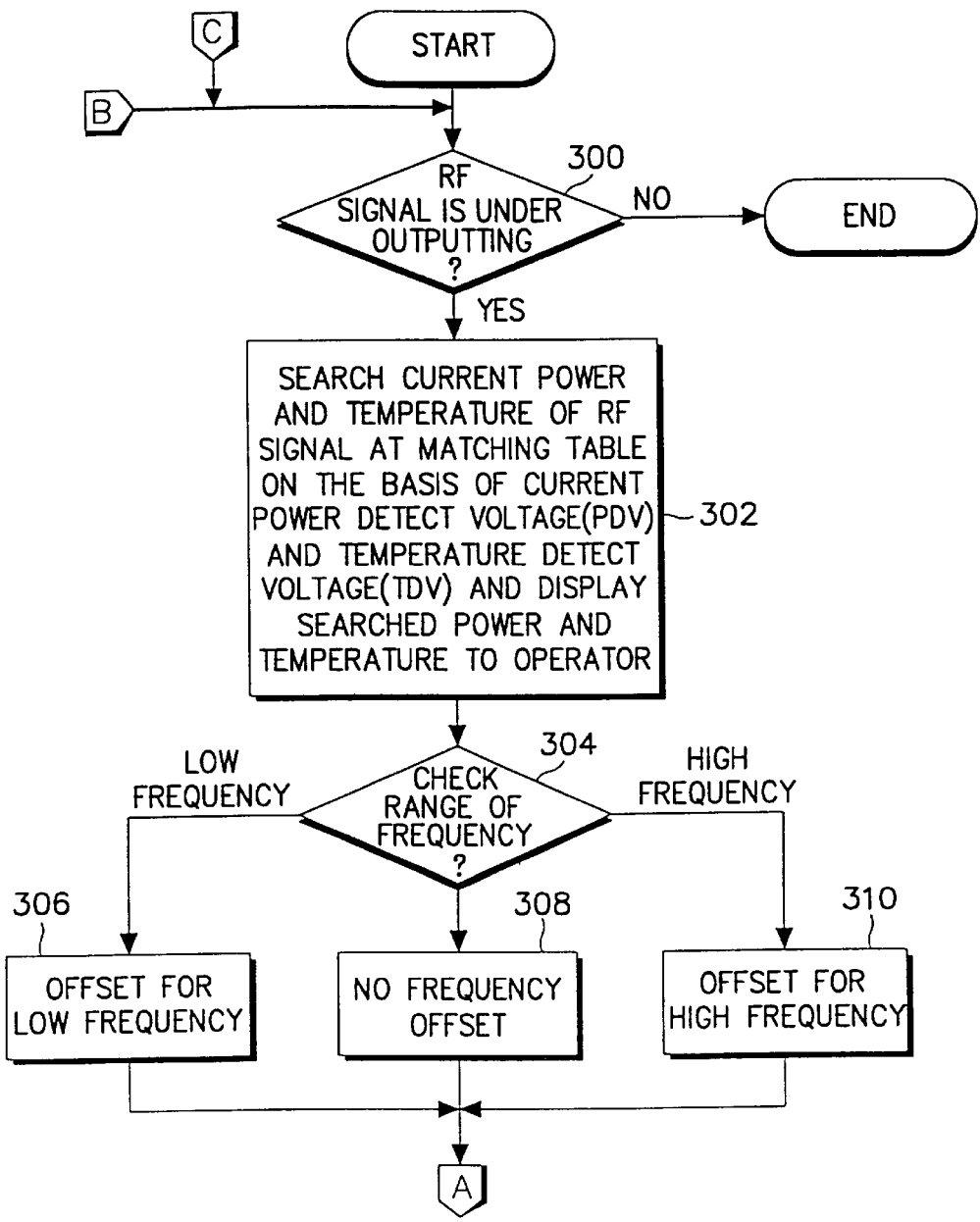
FIGS. 3A and 3B are flow charts showing RF power control operations according to an embodiment of the present invention.
Figure 3B:
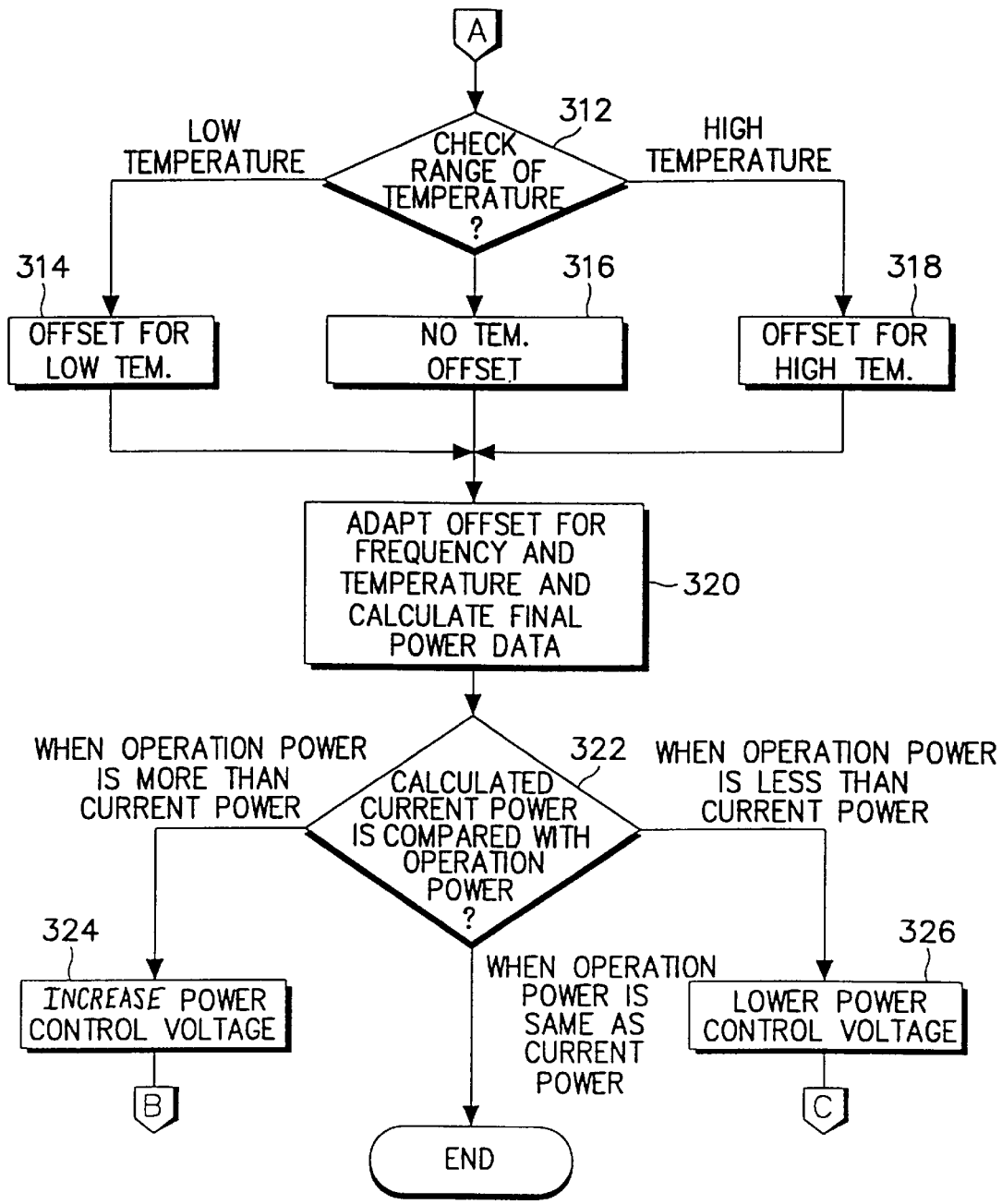
Figure 4:
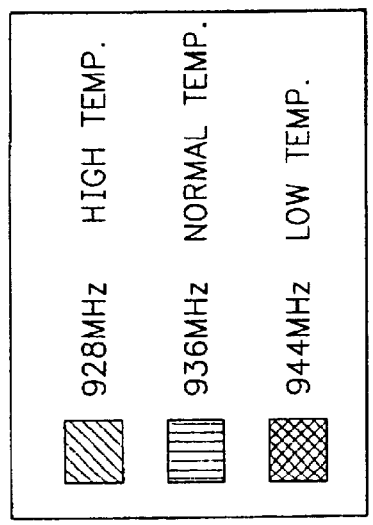
FIG. 4 is a graphical chart diagram showing a comparison of the control unit directive value and a power meter directive value of RF power as a function of frequency and temperature according to the prior art paging transmitter.
Figure 4:
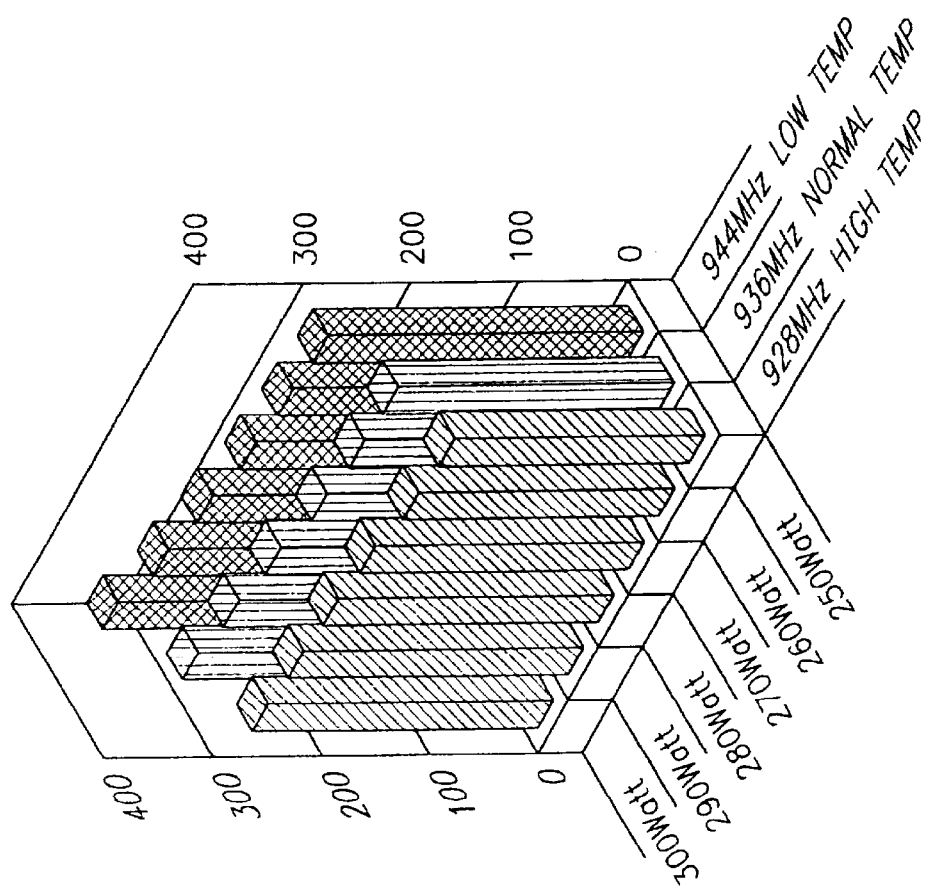
Figure 5:
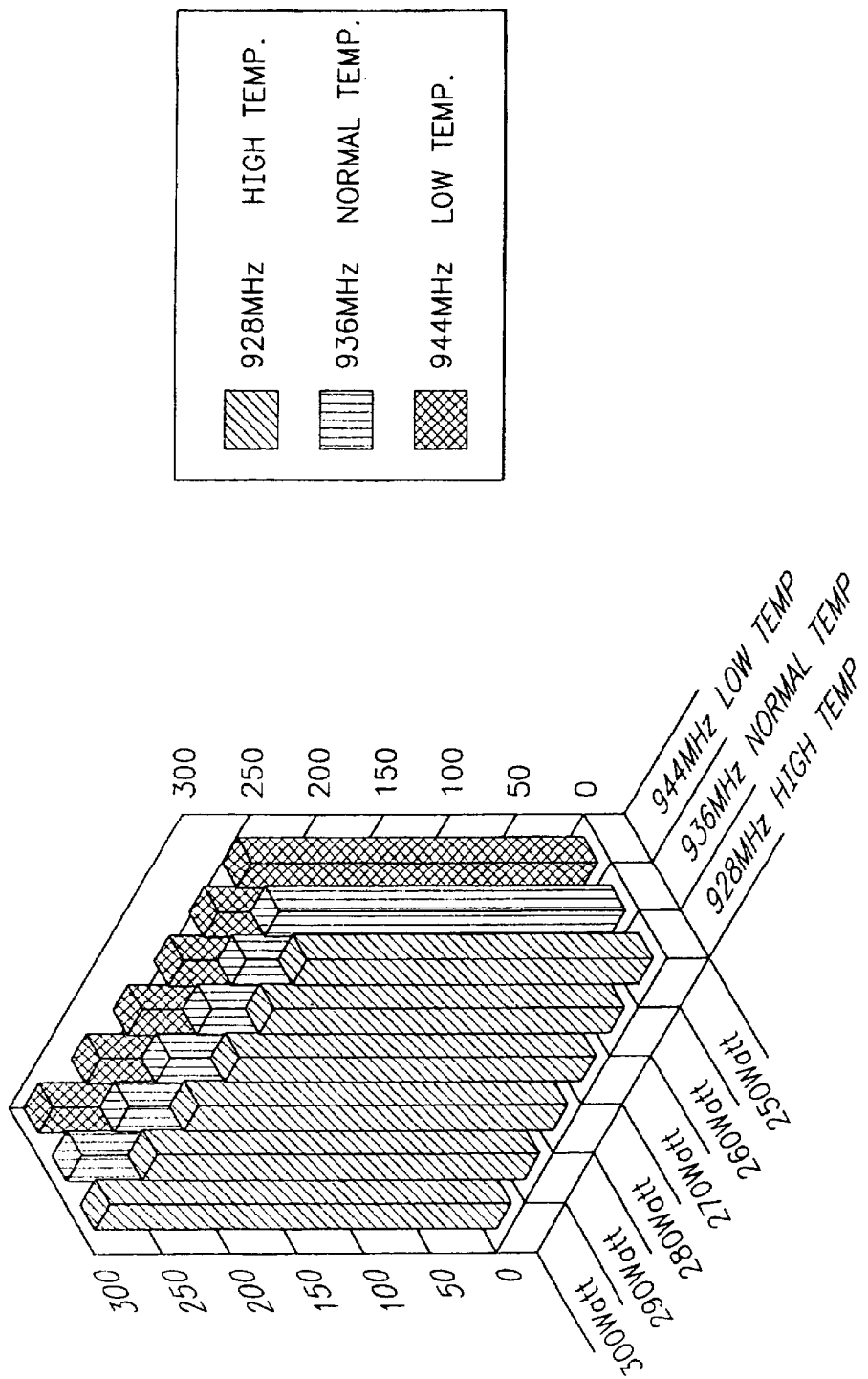
FIG. 5 is a graphical chart diagram showing a comparison of the control unit directive value and a power meter directive value of RF power as a function of frequency and temperature in a paging transmitter according to an embodiment of the present invention.

FIGS. 3A and 3B are flow charts show the RF power control operations in response to frequency and temperature variations according to an embodiment of the present invention.

Figure 2:
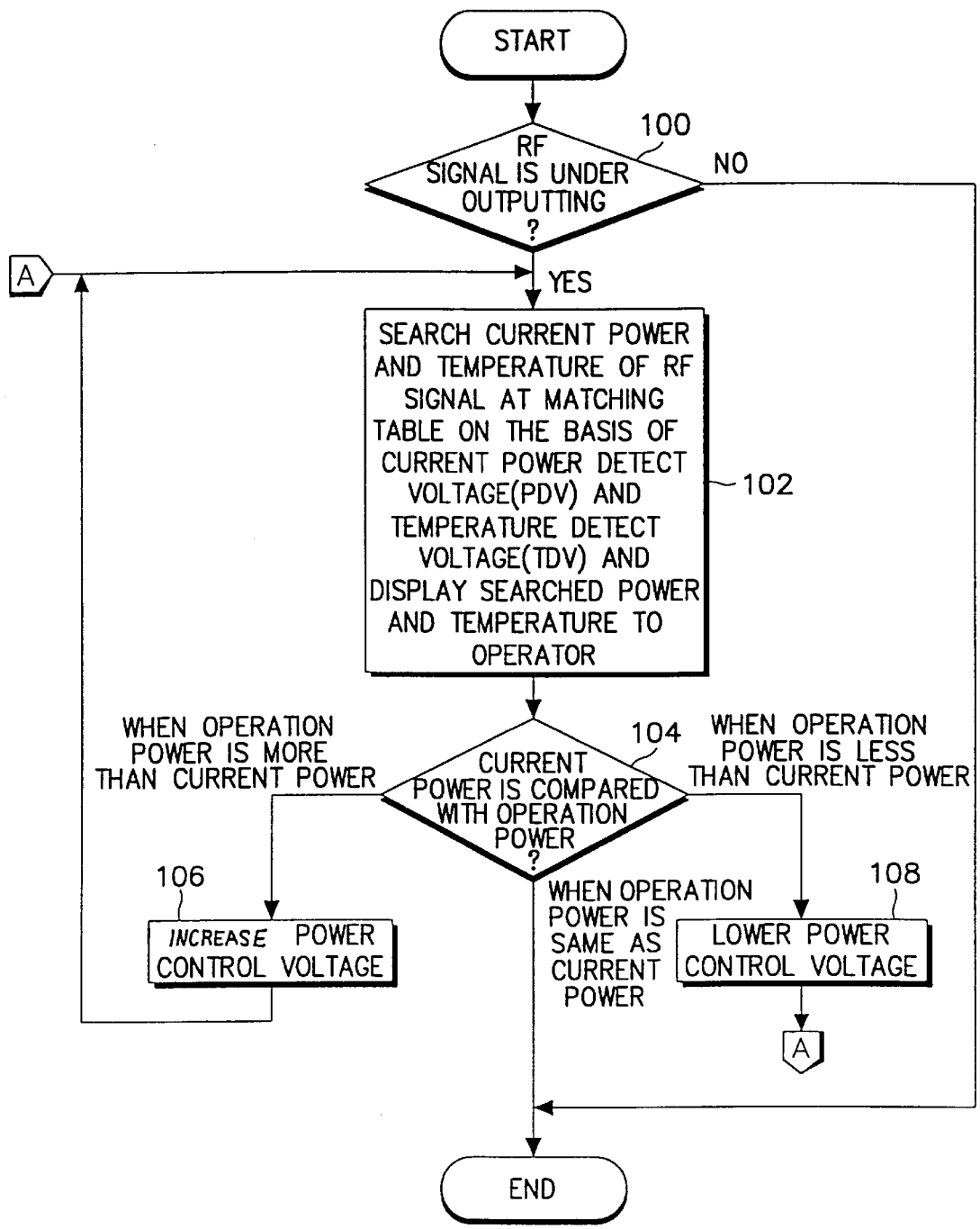
FIG. 2 is a flow chart showing conventional RF power control operations in a paging transmitter.

Referring to FIGS. 1–3, an operation according to the present invention can be described. The power detect voltage PDV and the temperature detect voltage TDV applied from the power detect unit 6 to the main control unit 8 are transmitted to the A/D converter of the main control unit 8, where the direct current voltage (the power detect voltage PDV and the temperature detect voltage TDV) is converted into a digital representation of the same. The converted voltage is then applied to the internal processor of control unit 8. The internal processor checks at step 300 whether or not the RF signal is under outputting. Thus, when determined that the RF signal was under outputting, the processor detects the current power of the RF signal which is made up of the power detect voltage (PDV) and the temperature detect voltage (TDV) values applied from the power detect unit 6 as digital data. Thereafter, the processor proceeds to step 302, and searches the current or detected power of the RF signal and the temperature thereof in a matching table contained in a memory. The searched power and temperature data is displayed to an operator as the power data.

The processor checks at step 304, whether the frequency of the power data is the high, low, or intermediate frequency. When the low frequency is detected, for example, 928 MHz, the processor proceeds to step 306 to apply the frequency offset for the low frequency obtained through the above method 2 (i.e., −7 watts) when the high frequency is detected, for example, 944 MHz, the processor proceeds to step 310 and applies the frequency offset for the high frequency obtained through the above method 2 (i.e., +5 watts). Otherwise, upon detection of the intermediate frequency, for example, 936 MHz, no frequency offset is required (step 308).

Once the frequency compensation procedure is complete, the processor proceeds to step 312, and thereby checks whether the temperature of the power data is high, low, or normal. When a low temperature is detected, the processor proceeds to step 314 so as to adapt the offset for low temperature obtained from the method 3 (i.e., +31 watts). When a high temperature is detected, the processor proceeds to step 318, and adapts or applies the offset for high temperature obtained from the method 3 (i.e., −28 watts). Otherwise, upon normal temperature, the processor does not adapt the temperature offset as indicated at step 316.

Hereafter, the processor proceeds to step 320, thereby adapting the offsets for frequency and temperature obtained and calculating final power data. An example of calculating the final data with adapting the offset for obtained frequency and temperature will be explained further in following explanation for real power control operation.

The processor proceeds to step 322 where it compares the current calculated power, that is the final power data, with the operation power. Here, when the current power data calculated with the frequency and temperature offsets is different from the operation power data, the processor increases or lowers the power control voltage (PCV) supplied to the power amplifier unit 4 by using the D/A converter. Namely, when determined that the operation power data is more than the current power, the processor increases the power control voltage PCV at step 324. However, when determined that the operation power data is less than the current power, the processor lowers the power control voltage PCV at step 326. In accordance with this, the power at the final terminal of the transmitter can be increased or lowered in relation to the power control voltage PCV. Thus, the power voltage applied to the main control unit 8 is also varied, and the processor enters a loop and repeats the above operations until the digital data of the voltage is equal to the operation power value.

An exemplary operation of the real power control by adapting the offset obtained through the above methods 1 to 3 is described as follows.

When the directive value of the main control unit 8 at 928 MHz and high temperature is 300 watts, the following power control is performed. The processor of the main control unit 8 maps the power detect voltage (PDV) and the temperature detect voltage (TDV) inputted through the power detect unit 6 through the matching table installed in memory when the power is currently under transmission. Also, the processor compares the frequency of the current transmitter. Since the frequency is positioned at the 928 MHz band, the processor has a −7 watt first offset. The processor also compares the temperature of the current transmitter. Since the temperature of the transmitter is high, the processor has a −28 watt second offset. Therefore, the overall offset becomes −35 watt(=−7−28) and the data displayed in the main control unit 8 for the current power has the value of 265 watts(=300−35). As a result, the processor increases the power control voltage (PCV) so that the directive value of the main control unit 8 becomes 300 watts. In this case, the power of the power meter becomes 298 watts increased from 263 watts by 35 watts.

In another embodiment of the present invention, upon adapting the above method in the case that the directive value of the main control unit 8 at 944 MHz, and low temperature, the offset becomes +36 watts(=5+31), which means that the data displayed at the main control unit 8 for the current power has the value of 366 watt(=300+36). Accordingly, the processor lowers the power control voltage PCV, and the value applied by the above method can be shown in following table 4.

With reference to table 4, it can be seen that the maximum error exists at the range of +−2%. Also, the comparative characteristics are shown for the variations in frequency and temperature.

TABLE 4

| main control unit directive value | power meter directive value | | |
|---|---|---|---|
| | 928 MHz (high temperature) | 936 MHz (normal temperature) | 944 MHz (low temperature) |
| 300 watt | 298 | 300 | 299 |
| 290 watt | 291 | 291 | 290 |
| 280 watt | 280 | 280 | 277 |
| 270 watt | 271 | 269 | 270 |
| 260 watt | 261 | 260 | 260 |
| 250 watt | 255 | 250 | 250 |

As is apparent from the foregoing, the present invention can maintain a stable RF power when selecting and transmitting over the wideband frequency and the wideband operation temperature range by using one paging transmitter in the paging system. Likewise, upon being engaged with the paging terminal, the present invention has an advantage in that the RF power of the paging transmitter located at the base station apart can be controlled from a remote location.

Therefore, it should be understood that the present invention is not limited to the particular embodiment disclosed herein as the best mode contemplated for carrying out the present invention, but rather that the present invention is not limited to the specific embodiments described in this specification, except as defined in the appended claims.

What is claimed is:

1. A method for controlling RF power of a paging transmitter having a matching table where the power value corresponding to power detect voltage of a radio signal transmitted from a base station and the temperature value corresponding to temperature detect voltage upon transmitting said radio signal are mapped, said paging transmitter being used at wide operation temperature range and at wideband frequencies, the method comprising the steps of:

detecting said power detect voltage of said radio signal and said temperature detect voltage of said radio signal to determine the current power of a) said radio signal upon transmission;

analyzing frequency and temperature characteristics of the radio signal upon transmission;

determining a frequency offset value when the analyzed frequency of the radio signal upon transmission is not in an intermediate range;

determining a temperature offset value when the analyzed temperature of the radio signal upon transmission is not in an intermediate range;

calculating a final power value, said final power value being compensated by said frequency offset value and said temperature offset value when applicable;

comparing said final power value of the radio signal with the current power; and adjusting the power of the transmitted radio signal in response to said comparison.

2. The method according to claim 1, further comprising the steps of:

searching the detected voltage values in the matching table; and displaying the searched values to an operator.

3. The method according to claim 1, wherein said step of compensating further comprises the steps of:

checking the frequency range of the current power of the radio signal; and applying a frequency offset value to the current power data when the frequency range is not within and intermediate range.

4. The method according to claim 3, wherein said frequency offset value represents a preset power error between the current power of the radio signal and an operation power determined based on the frequency range of a wide frequency band.

5. The method according to claim 3, further comprising the step of determining the frequency offset value, said step of determining comprising the steps of:

subtracting an average value of current powers of each frequency range from a reference value, wherein said reference value is an average of operation power values.

6. The method as claimed in claim 3, wherein said frequency offset value is −7 watts when operating in a lowband frequency range of 928 MHz.

7. The method as claimed in claim 3, wherein said frequency offset value is +5 watts when operating in a highband frequency range of 944 MHz.

8. The method according to claim 1, wherein said step of compensating further comprises the steps of:

checking the temperature range of the current power of the radio signal; and applying a temperature offset value to the current power data when the frequency range is not within an intermediate range.

9. The method according to claim 8, wherein said temperature offset value represents a preset power error between the current power of the radio signal and an operation power determined according to the temperature range of a wide operation temperature band.

10. The method according to claim 8, further comprising the step of determining the temperature offset value, said step of determining comprising the steps of:

subtracting an average value of current powers of each temperature range from a reference value, wherein said reference value is an average of operation power values.

11. The method as claimed in claim 4, wherein said temperature offset value is −28 watts when operating at high temperature range.

12. The method as claimed in claim 4, wherein said temperature offset value is +31 watts when operating at low temperature range.

13. The method according to claim 1, further comprising the step of constantly maintaining the power of said paging transmitter.

14. The method recited in claim 1, wherein the frequency and temperature characteristics of the radio signal are analyzed to detect power errors resulting from temperature and frequency variations, and said detected power errors are compensated for in the calculated final power value.

* * * * *